United States Patent
Annapragada et al.

(10) Patent No.: US 6,518,174 B2
(45) Date of Patent: Feb. 11, 2003

(54) COMBINED RESIST STRIP AND BARRIER ETCH PROCESS FOR DUAL DAMASCENE STRUCTURES

(75) Inventors: Rao Annapragada, Union City, CA (US); Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 26 days.

(21) Appl. No.: 09/746,894

(22) Filed: Dec. 22, 2000

(65) Prior Publication Data

US 2002/0119664 A1 Aug. 29, 2002

(51) Int. Cl.$^7$ .................. H01L 21/4763; H01L 21/302
(52) U.S. Cl. ........................ 438/637; 438/700
(58) Field of Search ................... 438/637, 689, 438/692, 700, 717, 735, 736, 737, 738, 740, 638, 643, 671

(56) References Cited

U.S. PATENT DOCUMENTS

| | | | | |
|---|---|---|---|---|
| 6,083,822 A | * | 7/2000 | Lee | 257/750 |
| 6,123,088 A | * | 9/2000 | Ho | 134/1.3 |
| 6,184,128 B1 | * | 2/2001 | Wang et al. | 438/637 |
| 6,235,653 B1 | * | 5/2001 | Chien et al. | 438/769 |

OTHER PUBLICATIONS

U.S. patent application No. 09/746,901, Entitled "Method of Preventing Damage to Organo–Silicate–Glass Materials during Resist Stripping", Filed Dec. 22, 2000, Inventor(s): Annapragada.

U.S. patent application No. 09/746,900, Entitled "Method of Etching with NH3 and Fluorine Chemistries", Filed Dec. 22, 2000, Inventor(s): Annapragada et al.

* cited by examiner

Primary Examiner—William David Coleman
(74) Attorney, Agent, or Firm—Beyer Weaver & Thomas, LLP

(57) ABSTRACT

A method of etching a stack is provided. Generally, a trench patterned resist layer is placed over a dielectric layer of the stack. A trench is partially etched into the dielectric layer. A simultaneous stripping of the trench patterned resist layer, etching the barrier layer, and etching the trench is then performed. As a result an etch stack may be provided with less damage. The method may be used to provide a dual damascene structure. The dual damascene structure may be provided by etching a via before placing the trench patterned resist layer over the dielectric layer of the stack.

12 Claims, 10 Drawing Sheets

COMBINED RESIST STRIP AND BARRIER ETCH PROCESS FOR DUAL DAMASCENE STRUCTURES

BACKGROUND OF THE INVENTION

The present invention relates to the fabrication of semiconductor-based devices. More particularly, the present invention relates to improved techniques for fabricating semiconductor-based devices with dual damascene structures.

In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. In dual damascene, instead of etching the conductor material, vias, and trenches may be etched into the dielectric material and filled with copper.

To facilitate discussion, FIG. 1A is a cross-sectional view of a stack 100 on a wafer 110 used in the damascene process of the prior art. A contact 104 may be placed in a dielectric layer 108 over a wafer 110. A barrier layer 112, which may be of silicon nitride or silicon carbide, may be placed over the contact 104 to prevent the copper diffusion. A via level dielectric layer 116 may be placed over the barrier layer 112. A trench stop layer 120 (silicon carbide or silicon nitride) may be placed over via level dielectric 116. A trench level dielectric layer 124 may be placed over the trench stop layer 120. An ARC layer 128 may be placed over the trench dielectric layer 124. A patterned resist layer 132 may be placed over the hard mask layer 128. The via level dielectric layer 116 and the trench level dielectric layer 124 may be formed from a low dielectric constant OSG material. The trench etch stop layer 120 and ARC layer 128 may be formed from (silicon carbide or silicon nitride for trench stop layer and SiON for ARC layer).

FIG. 2 is a high level flow chart of a process used in the prior art to form the stack 100 into dual damascene structure. The stack 100 may be subjected to an etch, which etches a via 140 down to the barrier layer 112 (step 204). The etching of the via 140 may form a crust 144 which forms sidewalls. The crust 144 and resist 132 may be removed and repatterned to form a new resist layer 160, which is patterned to form a trench (step 208), as shown in FIG. 1C. The stack may be subjected to an etch, which etches a trench 164 down to the trench etch stop layer 120 (step 212), as shown in FIG. 1D. The etching of the trench 164 may cause part of the via level dielectric layer 116 to facet 172. This faceting may be considered as damage to the dual damascene structure. The etching of the trench 164 may also form a new crust 168, which forms sidewalls. The stack 100 may then be subjected to a barrier layer etch (step 216), which opens the via 140 to the copper contact 104, as shown in FIG. 1E. Removal of the barrier material of the barrier layer 112 is a challenge considering the poor selectivities between conventional dielectric materials and barrier materials. The resist layer 160 and crust 168 may then be stripped (step 220), to provide the structure shown in FIG. 1F.

It is desirable to provide an efficient etching process with minimal structure damage.

SUMMARY OF THE INVENTION

To achieve the foregoing and other objects and in accordance with the purpose of the present invention for etching a stack. Generally, a trench patterned resist layer is placed over a dielectric layer of the stack. A trench is partially etched into the dielectric layer. A simultaneous stripping of the trench patterned resist layer, etching the barrier layer, and etching the trench is then performed. As a result an etch stack may be provided with less damage.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
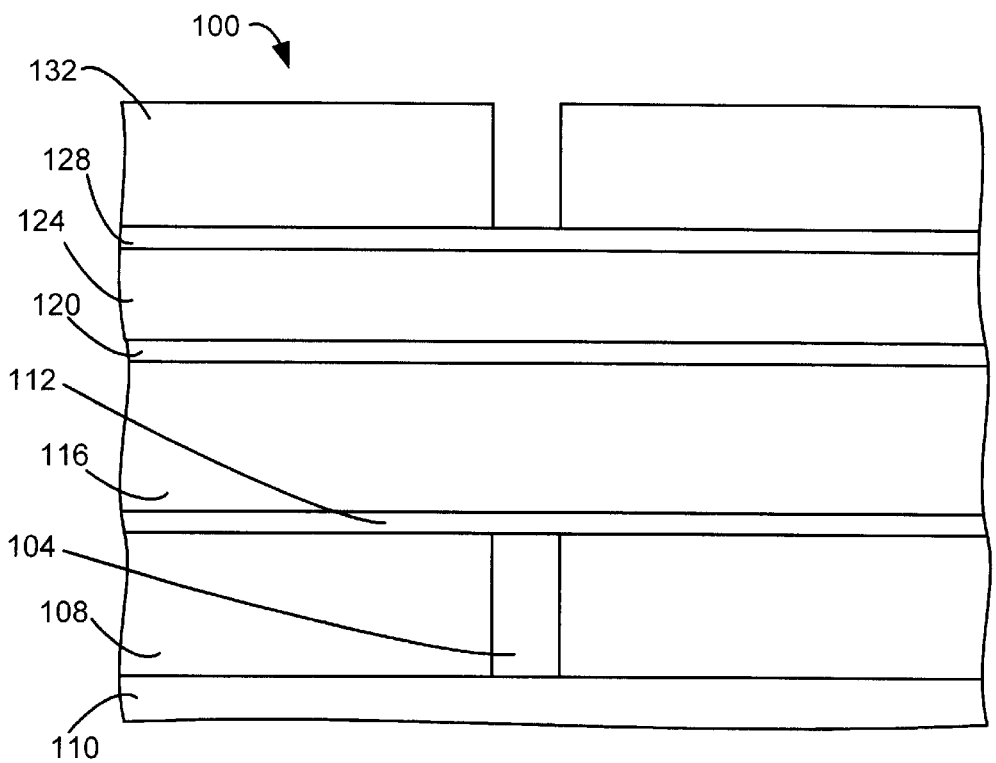
FIGS. 1A–F are cross-sectional views of a stack on a wafer used in the damascene process of the prior art.
Figure 1B:
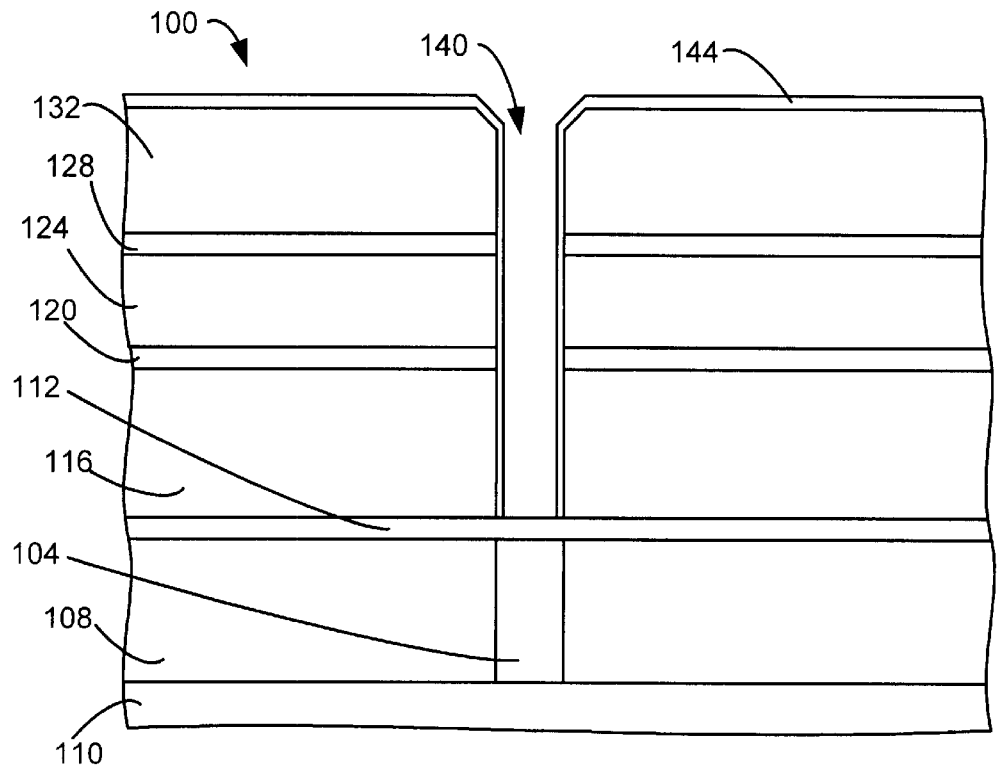
Figure 1C:
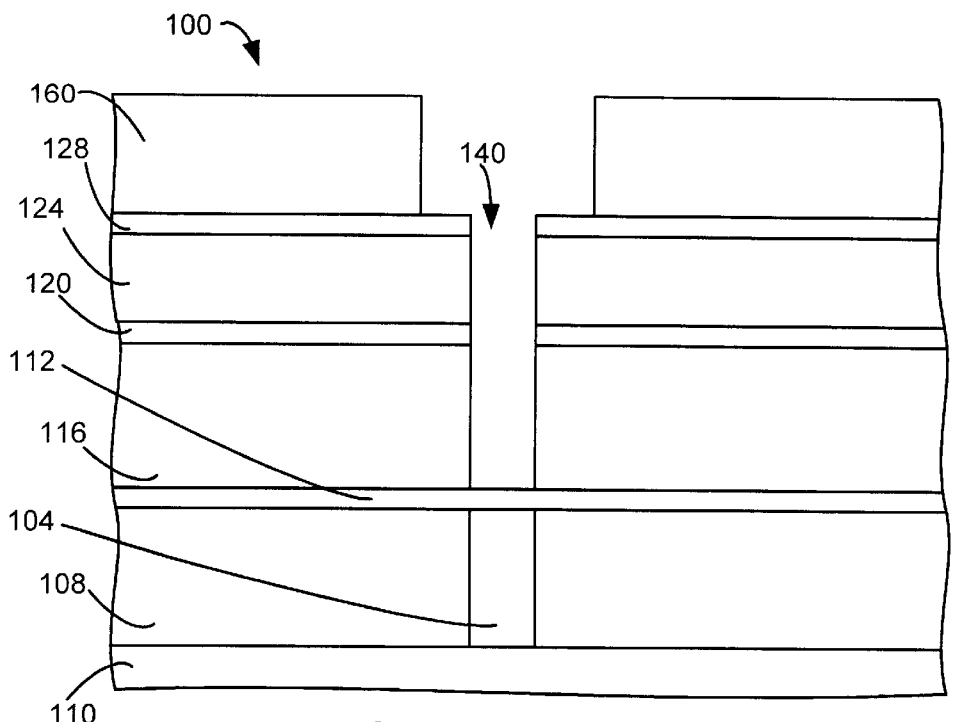
Figure 1D:
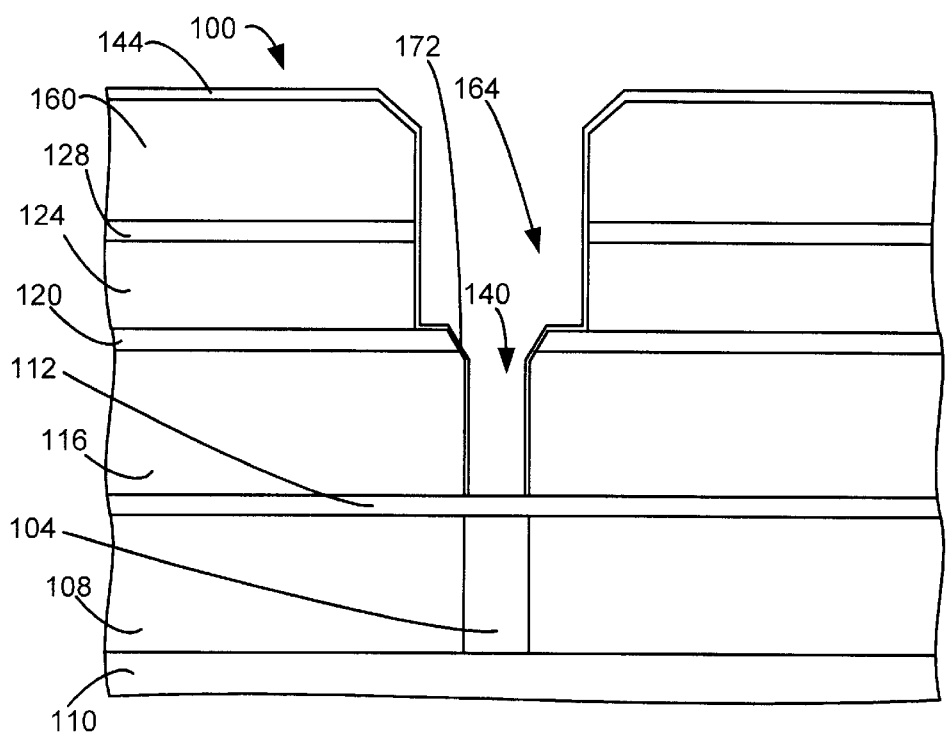
Figure 1E:
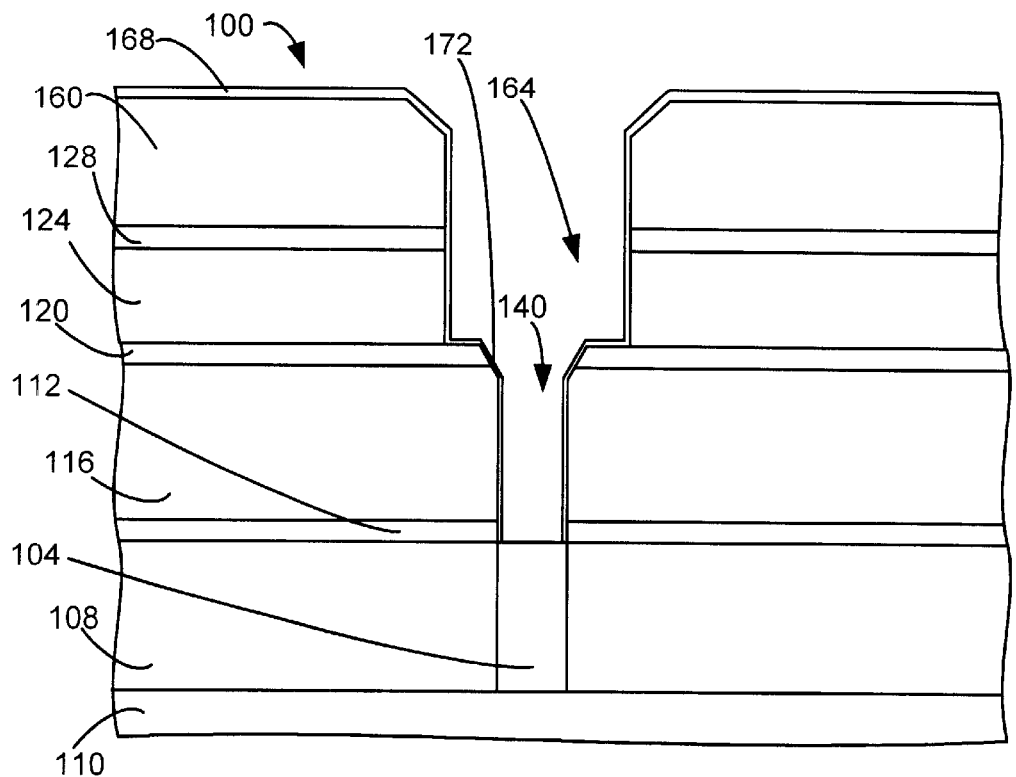
Figure 1F:
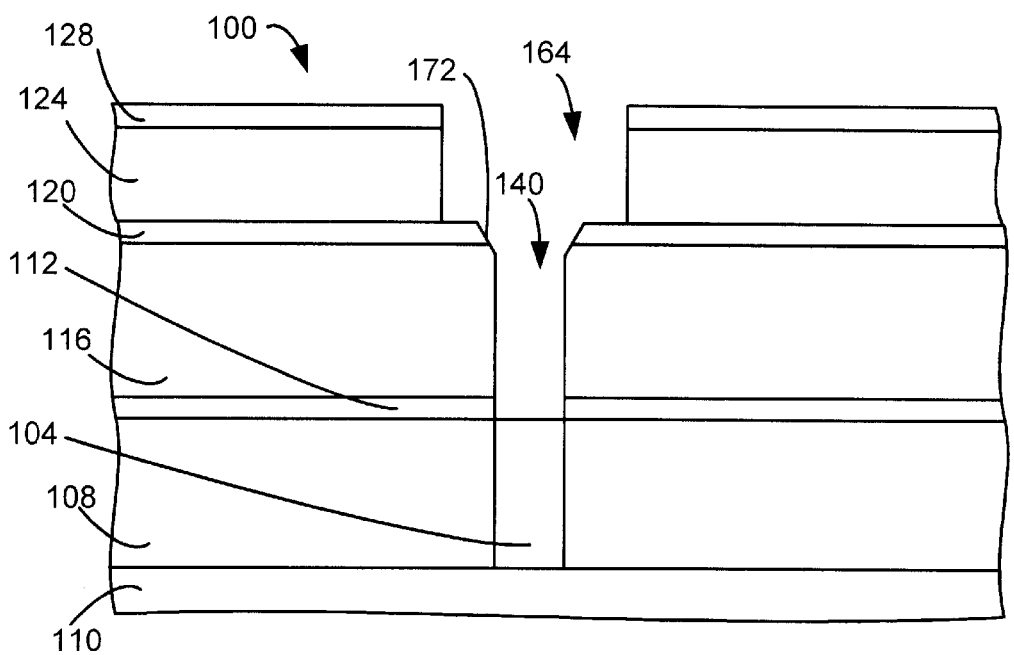
Figure 2:
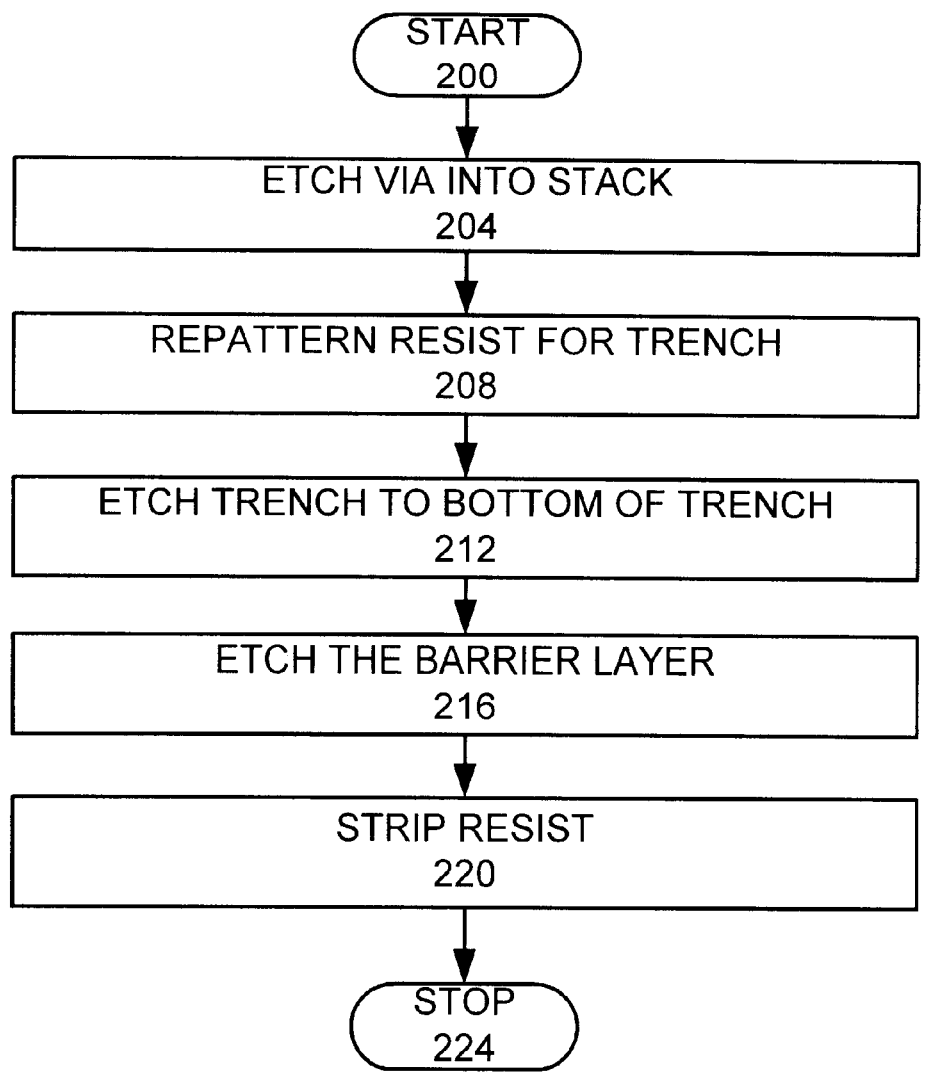
FIG. 2 is a high level flow chart of a process used in the prior art to form the stack into dual damascene structure.
Figure 3:
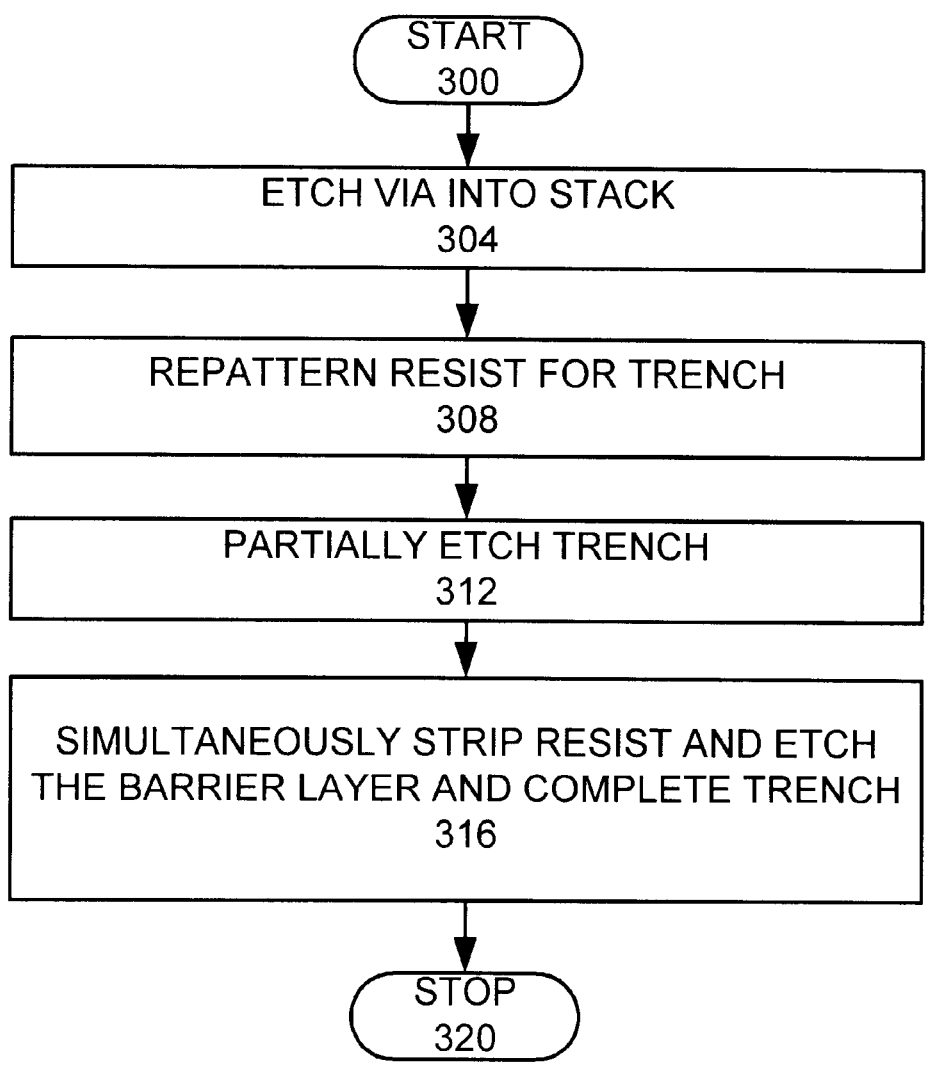
FIG. 3 is a flow chart of a process used in a preferred embodiment of the invention.
Figure 4A:
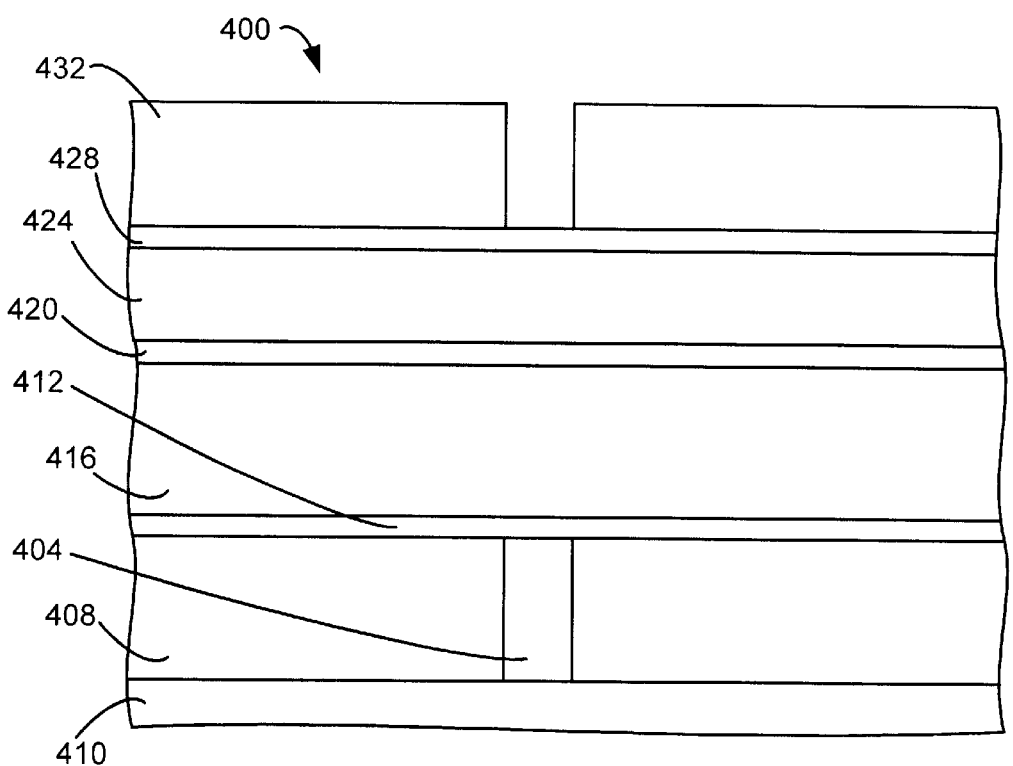
FIGS. 4A–E are cross-sectional views of a stack that is etched according to the preferred embodiment of the invention.

To facilitate discussion, FIG. 3 is a flow chart of a process used in a preferred embodiment of the invention. FIG. 4A is a cross-sectional view of a stack 400 on a wafer 410 used in the dual damascene process of the preferred embodiment of the invention. A contact 404 may be placed in a dielectric layer 408 over a wafer 410. A barrier layer 412, which may be of silicon nitride or silicon carbide, may be placed over the contact 404 to prevent the copper diffusion. A via level dielectric layer 416 may be placed over the barrier layer 412 and the dielectric layer 408. A trench stop layer 420 (silicon carbide or silicon nitride) may be placed over via level dielectric 416. A trench level dielectric layer 424 may be placed over the trench stop layer 420. An ARC layer 428 may be placed over the trench dielectric layer 424. A patterned resist layer 432 may be placed over the hard mask layer 428. The via level dielectric layer 416 and the trench level dielectric layer 424 may be formed from a low dielectric constant OSG material. The trench etch stop layer 420 and ARC layer 428 may be formed from (silicon carbide or silicon nitride for trench stop layer and SiON for ARC layer).. The patterned resist layer 432 may be a photo resist material where the layer 428 is an antireflective coating.

Figure 4B:
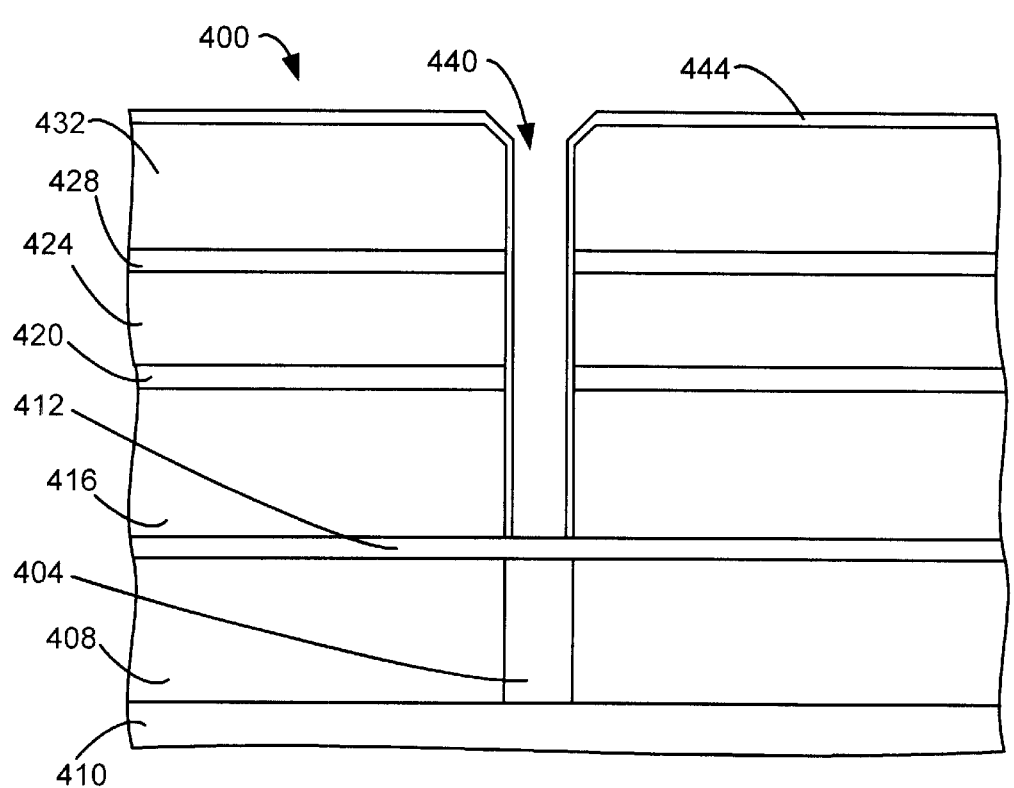
Figure 4C:
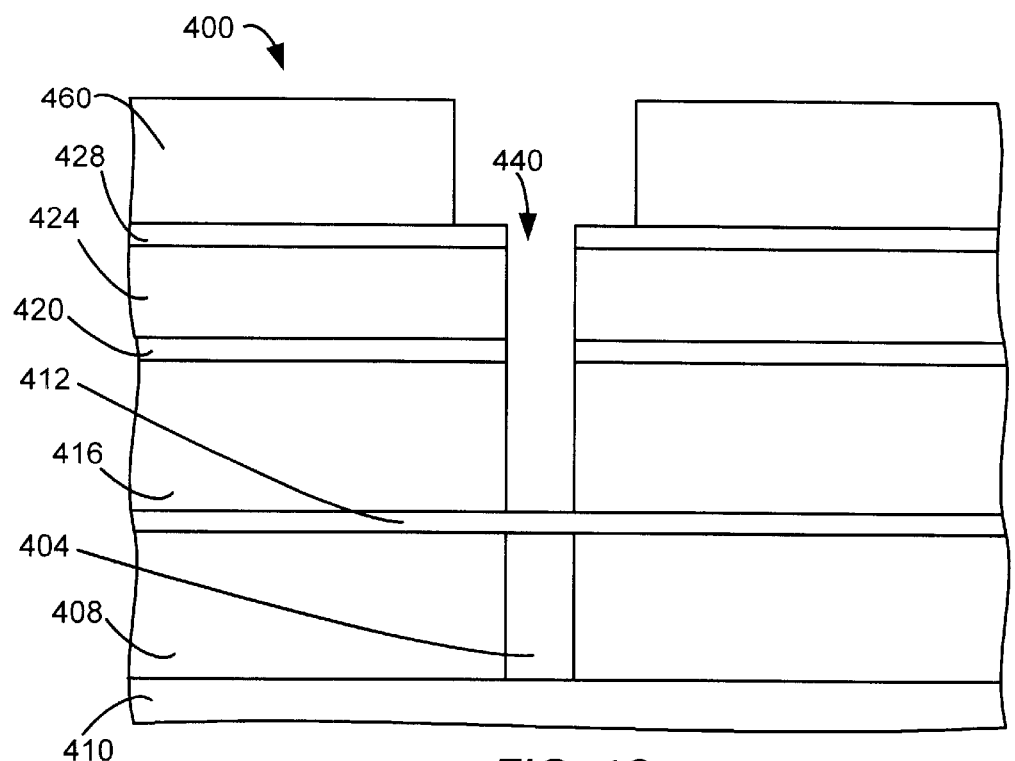
Figure 4D:
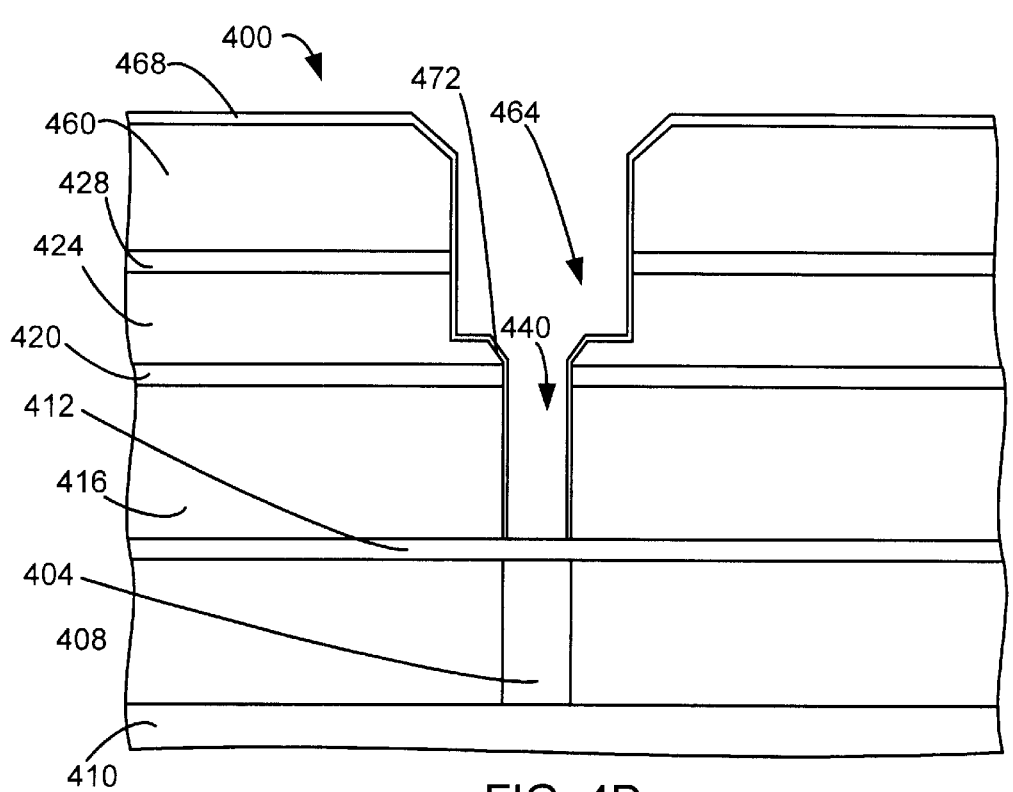
Figure 4E:
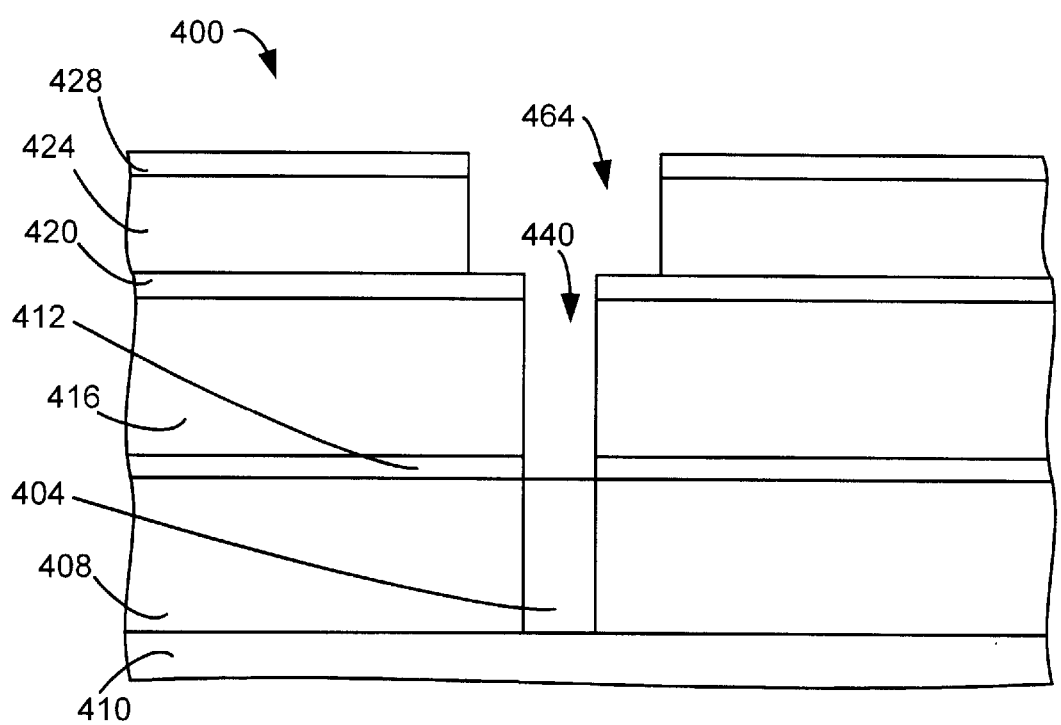

A via 440 is etched into the stack 400 down to the barrier layer 112 (step 304), as shown in FIG. 4B. The etching of the via 440 may form a crust 444 which forms sidewalls. The crust 444 and resist 432 may be removed and repatterned to form a new resist layer 460, which is patterned to form a trench (step 308), as shown in FIG. 4C. The stack may be subjected to an etch, which partially etches a trench 464 down to a level above the trench stop dielectric layer 420 (step 312), as shown in FIG. 4D. The etching of the trench 464 may cause part of the via to facet 472. This faceting may be considered as damage to the dual damascene structure. The partial etching of the trench may damage the dual damascene structure within the trench area in other ways. The etching of the trench 464 may also form a new crust 468, which forms sidewalls. The stack 400 is then subjected to a simultaneous resist strip and etching of the barrier layer 412 and trench to complete the trench 464 (step 316) to provide the stack 400 shown in FIG. 4E. The simultaneous etching of the barrier layer 412 and completion of the trench 464 may help to etch away the facets 472 and other damage to the trench area.

Figure 5:
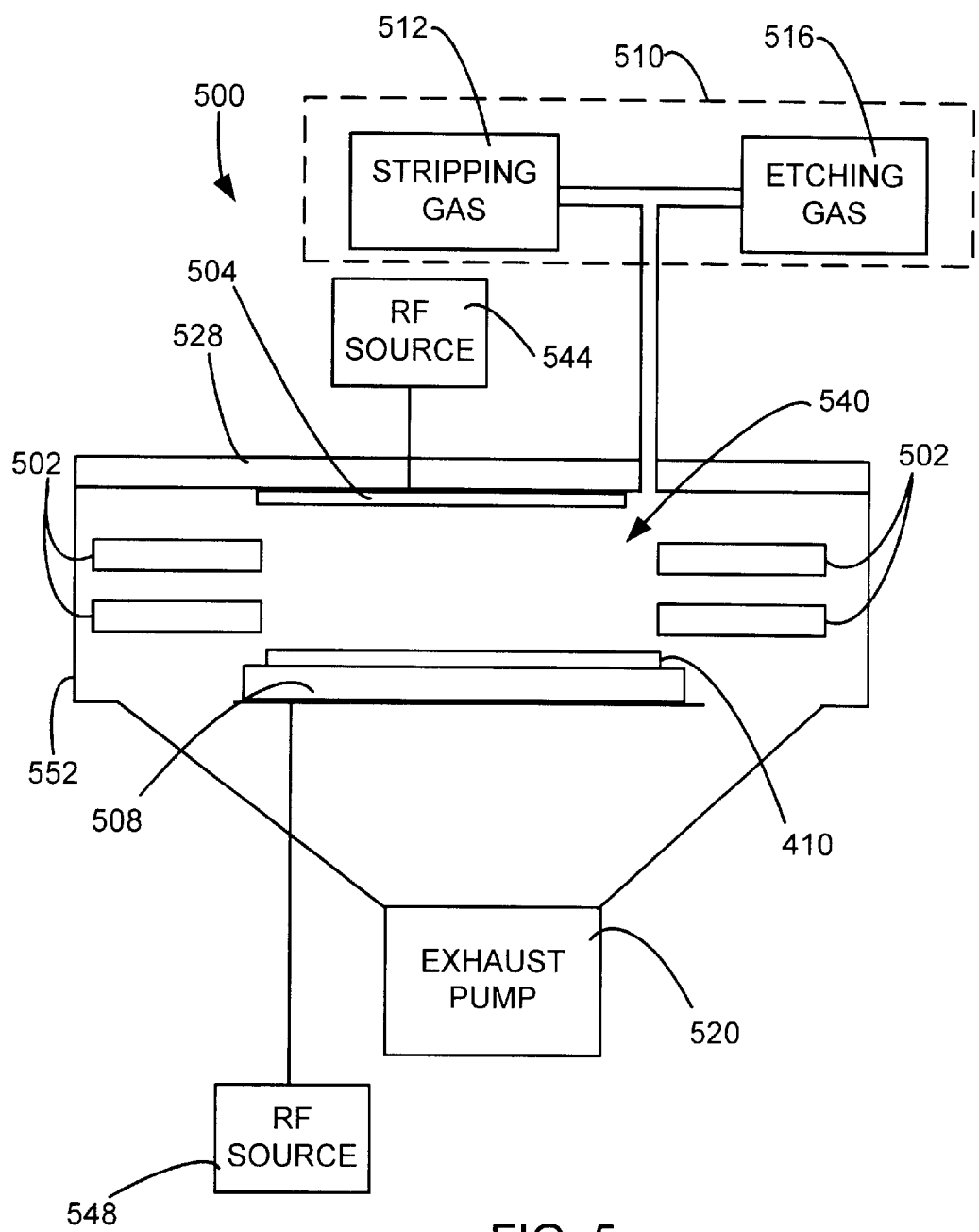
FIG. 5 is a schematic view of a plasma processing chamber that may be used in a preferred embodiment of the invention.

FIG. 5 is a schematic view of a plasma processing chamber 500. The plasma processing chamber 500 comprising confinement rings 502, an upper electrode 504, a lower electrode 508, a gas source 510, and an exhaust pump 520. The gas source 510 comprises a stripping gas source 512 and an etching gas source 516. The gas source 510 may comprise additional gas sources. Within plasma processing chamber 500, the wafer 410 is positioned upon the lower electrode 508. The lower electrode 508 incorporates a suitable substrate chucking mechanism (e.g., electrostatic, mechanical clamping, or the like) for holding the wafer 410. The reactor top 528 incorporates the upper electrode 504 disposed immediately opposite the lower electrode 508. The upper electrode 504, lower electrode 508, and confinement rings 502 define the confined plasma volume. Gas is supplied to the confined plasma volume by gas source 510 and is exhausted from the confined plasma volume through the confinement rings 502 and an exhaust port by the exhaust pump 520. A first RF source 544 is electrically connected to the upper electrode 504. A second RF source 548 is electrically connected to the lower electrode 508. Chamber walls 552 surround the confinement rings 502, the upper electrode 504, and the lower electrode 508. Both the first RF source 544 and the second RF source 548 may comprise a 27 MHz power source and a 2 MHz power source. Different combinations of connecting RF power to the electrode are possible. In case of Exelan HP made by LAM Research Corporation™ of Fremont, Calif., that may be used in a preferred embodiment of the invention, both the RF sources are connected to the lower electrode and the upper electrode is grounded.

Figure 6:
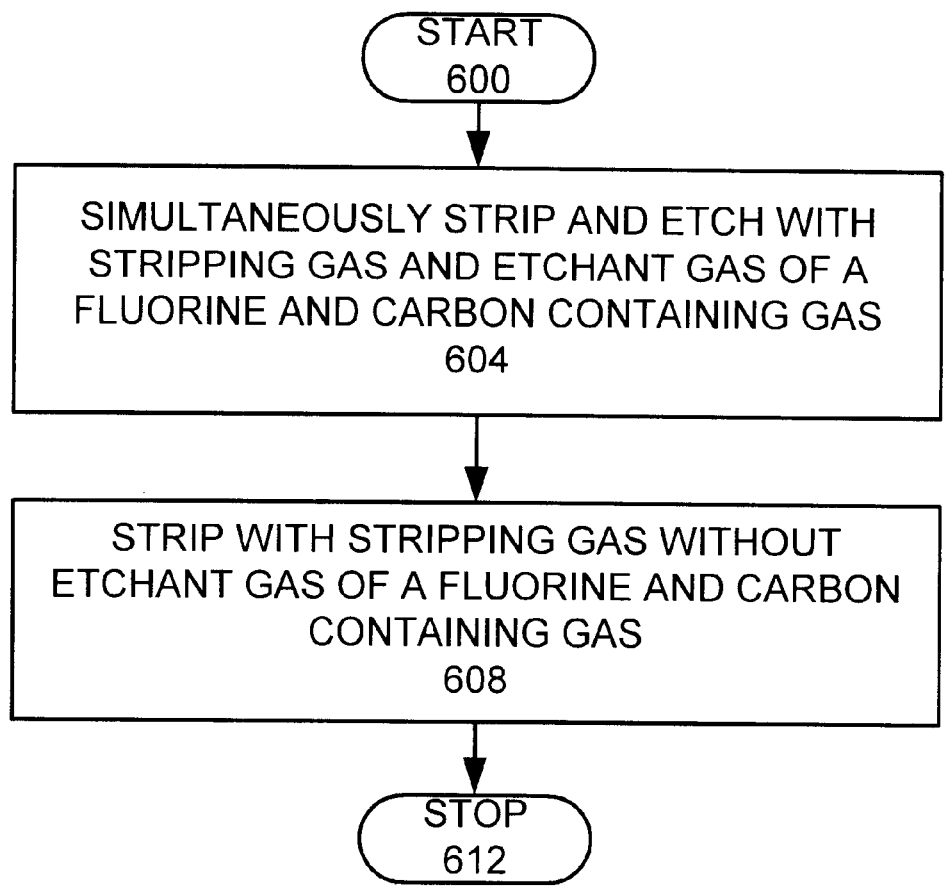
FIG. 6 is a more detailed flow chart of the step of simultaneously resist stripping and etching the barrier layer and the trench to complete the trench.

FIG. 6 is a more detailed flow chart of the step of simultaneously resist stripping and etching the barrier layer 412 and the trench to complete the trench (step 316). The wafer 410 is placed on the lower electrode 508, or may already be on the lower electrode 508 for previous processing steps. A stripping gas from the stripping gas source 512 is combined with an etching gas of a fluorine and carbon containing gas from the etching gas source 516 are provided by the gas source 510 into the chamber 500. The gas from the stripping gas source 512 and the etching gas source 510 are used to generate a plasma to simultaneously strip the resist layer 460, complete the etch of the trench 464, and etch the barrier layer 412 (step 604). The etching of the barrier layer 412 may take on the order of 30 seconds. When the barrier layer 412 is completely etched through and the trench 464 etching is completed the gas containing a fluorine and carbon containing etching gas from the etching gas source 516 is discontinued and only the stripping gas is provided to the plasma, which completes the removal of the resist layer 460, without further etching the dielectric material forming the trench and via and without further etching the barrier layer (step 608).

In examples of recipes that have been found to be successful in simultaneously stripping the resist, which is a photo resist, and etching the barrier layer and the trench an etching gas containing a carbon source and a fluorine source, such as carbon tetrafluoride $CF_4$, may be used. Fluorocarbons, hydrofluorocarbons, or mixtures of carbon and fluorine containing gas may be used for the etching gas. Preferably the etching gas includes Fluorocarbons or hyrdrofluorocarbons. More preferably the etching gas comprises $CF_4$. The Exelan HP may have a first power source, which provides a 2 MHz output and a second power source with a 27 MHz output. A medium density plasma with an electron density of between $10^{11}$ to $10^9$ electrons per $cm^3$ may be provided. More preferably the electron density may be about $10^{10}$ $cm^{-3}$.

In an example recipe using $O_2/N_2$ and $CF_4$ as an etchant gas, Table 1 provides a range of parameters that are preferred in such a process.

TABLE 1

| PARAMETERS | BROAD RANGE | PREFERRED RANGE | MORE PREFERRED RANGE |
| --- | --- | --- | --- |
| Pressure (mTorr) | 100–2000 | 200–1000 | 300–360 |
| Power from First Power Source (Watts) | 0–600 | 0–300 | <50 |
| Power from Second Power Source (Watts) | 50–1200 | 100–600 | 200–300 |
| Flow Rate of $O_2$ (sccm) | 200–6000 | 400–3000 | 900–1100 |
| Flow Rate of $N_2$ (sccm) | 0–1000 | 0–500 | 180–220 |
| Flow Rate of $CF_4$ (sccm) | 1–200 | 1–100 | 20–60 |

In an example recipe using $NH_3$, $N_2$, and $CF_4$ as an etchant gas, Table 2 provides a range of parameters that are preferred in such a process.

TABLE 2

| PARAMETERS | BROAD RANGE | PREFERRED RANGE | MORE PREFERRED RANGE |
| --- | --- | --- | --- |
| Pressure (mTorr) | 100–2000 | 200–1000 | 300–360 |
| Power from First Power Source (Watts) | 0–600 | 0–300 | <50 |
| Power from Second Power Source (Watts) | 100–2000 | 200–1000 | 500–700 |
| Flow Rate of $NH_3$ (sccm) | 250–6000 | 500–3000 | 1000–2000 |
| Flow Rate of $N_2$ (sccm) | 0–600 | 0–300 | <100 |
| Flow Rate of $CF_4$ (sccm) | 1–200 | 1–100 | 20–60 |

In an example recipe using $N_2/H_2$ as etchant gases, Table 3 provides a range of parameters that are preferred in such a process.

TABLE 3

| PARAMETERS | BROAD RANGE | PREFERRED RANGE | MORE PREFERRED RANGE |
| --- | --- | --- | --- |
| Pressure (mTorr) | 100–2000 | 200–1000 | 400–540 |
| Power from First Power Source (Watts) | 50–2000 | 100–1000 | 300–500 |
| Power from Second Power Source (Watts) | 50–2000 | 100–1000 | 300–500 |
| Flow Rate of $H_2$ (sccm) | 100–2000 | 200–1000 | 500–700 |
| Flow Rate of $N_2$ (sccm) | 250–6000 | 500–3000 | 1800–2000 |
| Flow Rate of $CF_4$ (sccm) | 1–200 | 1–100 | 20–60 |

In other embodiments, the via level dielectric layer and the trench level dielectric layer may be a single dielectric layer. In the alternative the two layers separated by an etch stop layer, even though the trench level dielectric layer is placed over the via level dielectric layer.

The etching of a stack using an ammonium and fluorine containing gas as for a plasma source is described in U.S. patent application Ser. No. 09/736,900 entitled "Method of Etching With $NH_3$ AND Fluorine Chemistries" by Rao Anapragada and Reza Sadjadi, with the same filing date, and which is incorporated by reference.

Sidewalls formed by the crust may be removed during the stripping of the resist or may be removed using a separate wet stripping as described in U.S. patent application Ser. No. 09/746,901 entitled "Method of Preventing Damage To Organo-Silicate-Glass Materials During Resist Stripping" by Rao Anapragada, with the same filing date, and which is incorporated by reference.

The invention may reduce damage in a dual damascene structure, which may provide unique dual damascene structure with less damage. The invention may be used for etching a trench and barrier to make electrical contact with an underlying metal line or a metal contact.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method of etching a stack, wherein the stack comprises a barrier layer and a dielectric layer over the barrier layer, comprising:

placing a via patterned resist layer over the dielectric layer;

etching a via into the dielectric layer, wherein the etching the via etches the via to the barrier layer;

stripping the via patterned resist layer;

placing a trench patterned resist layer over the dielectric layer, wherein the placing a via patterned resist layer, etching the via, and stripping the via pattern resist layer is done before the placing the trench patterned resist;

partially etching a trench in the dielectric layer; and simultaneously stripping the trench patterned resist layer and the barrier layer, and completing the etching of the previously partially etched trench.

2. The method, as recited in claim 1, wherein the simultaneously stripping the trench patterned resist layer, etching the barrier layer, and completing the etching of the previously partially etched trench, comprises:

flowing a stripping gas and an etching gas into a plasma chamber; and generating a plasma from the stripping gas and etching gas.

3. The method, as recited in claim 2, wherein the simultaneously stripping the trench patterned resist layer, etching the barrier layer, and completing the etching of the previously partially etched trench, further comprises stopping the flow of the etching gas so that only stripping gas is flowed into the plasma chamber.

4. The method, as recited in claim 3, wherein the etching gas comprises a fluorine and carbon containing gas.

5. The method, as recited in claim 4, wherein the stopping to flow of the etching gas comprises stopping the flow of the fluorine and carbon containing gas.

6. The method, as recited in claim 1, wherein the simultaneously stripping the trench patterned resist layer, etching the barrier layer, and etching the trench, comprises:

flowing a stripping gas and an etching gas into a plasma chamber; and generating a plasma from the stripping gas and etching gas.

7. The method, as recited in claim 6, wherein the simultaneously stripping the trench patterned resist layer, etching the barrier layer, and etching the trench, further comprises stopping the flow of the etching gas so that only stripping gas is flowed into the plasma chamber.

8. The method, as recited in claim 7, wherein the etching gas comprises a fluorine and carbon containing gas.

9. The method, as recited in claim 8, wherein the stopping to flow of the etching gas comprises stopping the flow of the fluorine and carbon containing gas.

10. A method of etching a stack, wherein the stack comprises a barrier layer and a dielectric layer over the barrier layer, comprising:

placing a trench patterned resist layer over the dielectric layer;

partially etching a trench in the dielectric layer; and simultaneously stripping the trench patterned resist layer, etching completely through the barrier layer, and completing the etching of the previously partially etched trench.

11. The method, as recited in claim 10, further comprising:

placing a via patterned resist layer over the dielectric layer;

etching a via into the dielectric layer; and stripping the via patterned resist layer, wherein the placing a via patterned resist layer, etching the via, and stripping the via pattern resist layer are done before the placing the trench patterned resist.

12. The method, as recited in claim 11, wherein the etching the via etches the via to the barrier layer.

* * * * *